United States Patent [19]

Yasuda et al.

[11] 4,449,061
[45] May 15, 1984

[54] WAVE-SHAPING CIRCUIT FOR DIGITAL SIGNAL

[75] Inventors: Nobuyuki Yasuda; Kentaro Odaka, both of Tokyo, Japan

[73] Assignee: Sony Corporation, Tokyo, Japan

[21] Appl. No.: 273,729

[22] Filed: Jun. 15, 1981

[30] Foreign Application Priority Data

Jun. 17, 1980 [JP] Japan ............................. 55-82306

[51] Int. Cl.³ ............................................. H03K 5/08
[52] U.S. Cl. .................................. 307/268; 307/265; 307/359; 328/111; 328/164
[58] Field of Search ............... 307/261, 265, 268, 359, 307/354, 358; 328/147, 150, 111, 164

[56] References Cited

U.S. PATENT DOCUMENTS

| 3,493,874 | 2/1970 | Finkel et al. | 307/359 |
| 3,721,835 | 3/1973 | Hess | 307/265 |
| 3,737,790 | 6/1973 | Brown | 307/359 |
| 4,204,260 | 5/1980 | Nysen | 307/359 |

Primary Examiner—John Zazworsky
Attorney, Agent, or Firm—Hill, Van Santen, Steadman & Simpson

[57] ABSTRACT

A wave-shaping circuit for digital signal includes a slice or clipping circuit for slicing or clipping an input digital signal with a predetermined threshold level; a detecting circuit for detecting the pulse widths of high and low level portions of the sliced digital signal; and a control circuit which lowers the threshold level of the slice circuit, when the pulse width of the high level portion of the digital signal is short with respect to the normalized digital signal, and rises the threshold level of the slice circuit, when the pulse width of the low level portion of the digital signal is short with respect to the normalized digital signal.

13 Claims, 7 Drawing Figures

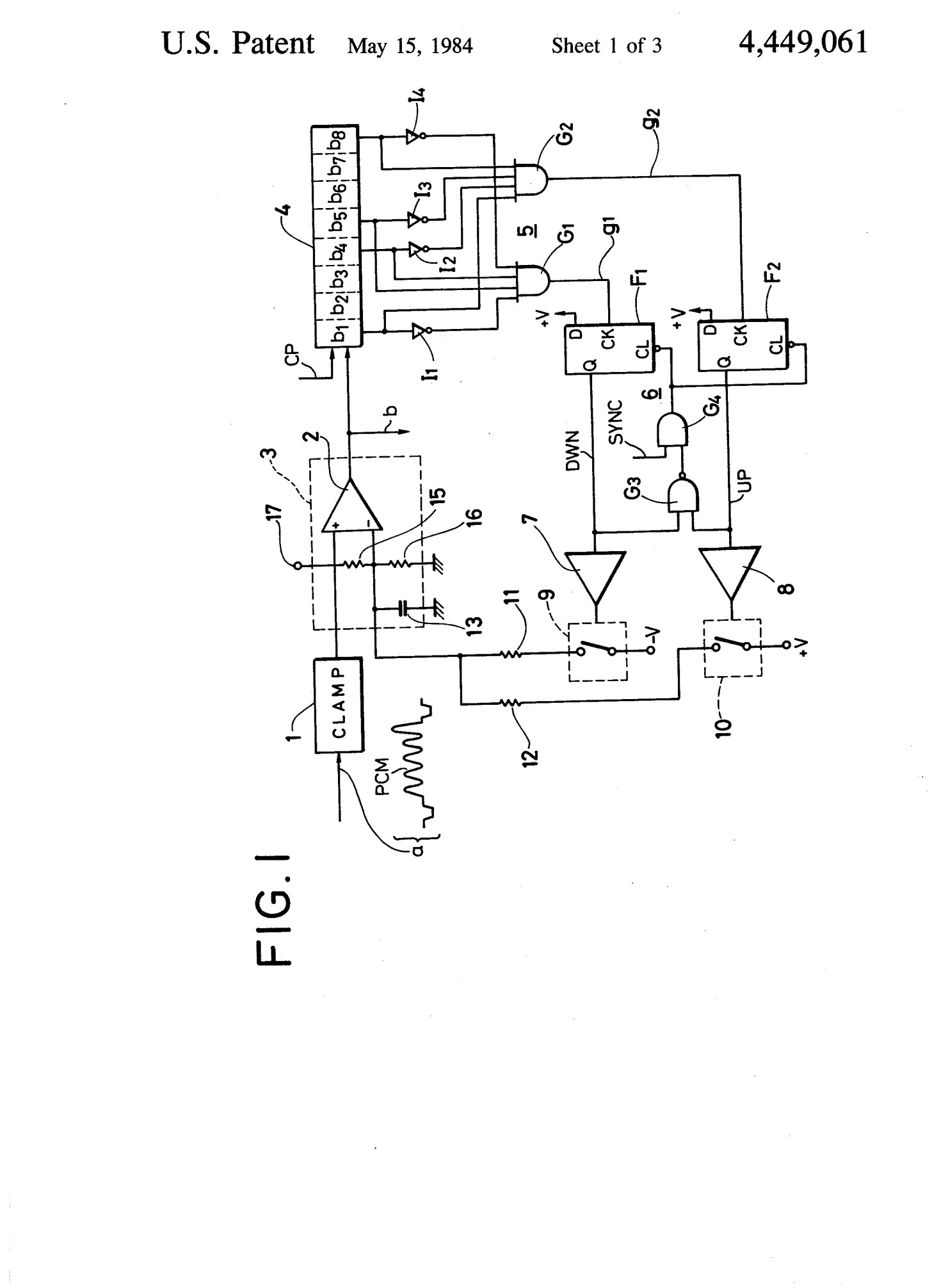

FIG. I

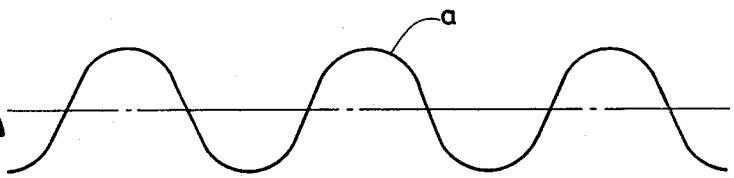
FIG.2A
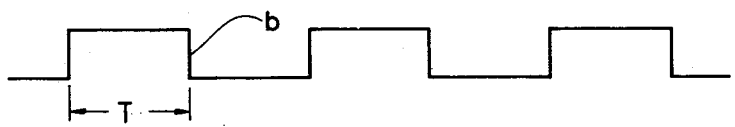
FIG.2B
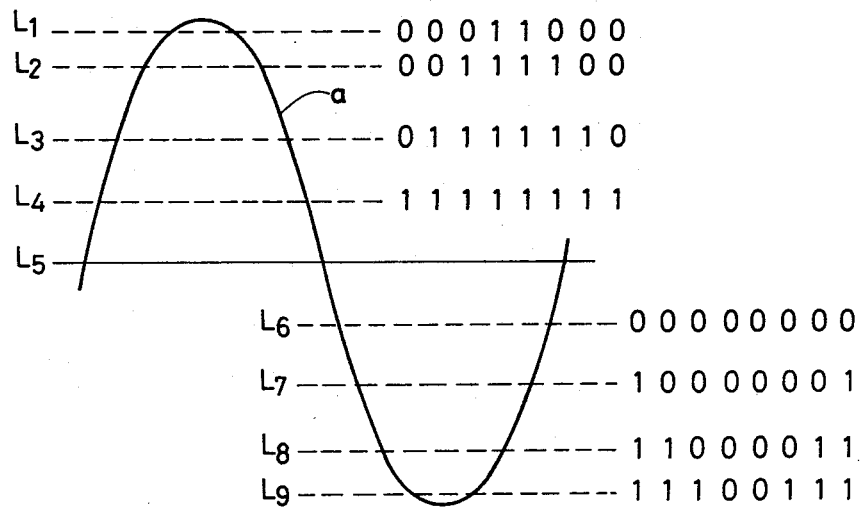
FIG.3A
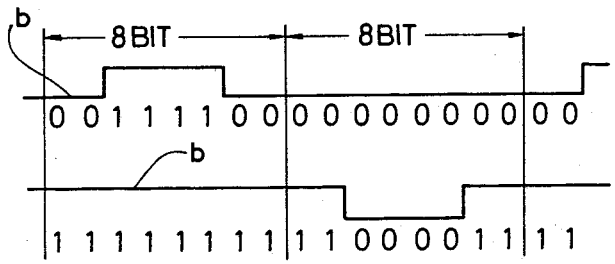
FIG.3B
FIG.3C

WAVE-SHAPING CIRCUIT FOR DIGITAL SIGNAL

BACKGROUND OF THE INVENTION

1. Field of the Invention

This invention relates to a wave-shaping circuit for digital signals, and more particularly to a wave-shaping circuit for digital signals which is suitable for the digital signal transmitted through a magnetic recording/reproducing apparatus.

2. Description of the Prior Art

A PCM recording/reproducing apparatus is known wherein a coded audio signal (PCM signal) is recorded with a helical scan type VTR (Video Tape Recorder), and which can be reproduced. In the PCM recording-/reproducing apparatus, the frequency of the PCM data (for example, 1.3 to 1.4 MH) is very close to the maximum transmission frequency of the recording/reproducing apparatus so as to transmit a PCM signal of high resolution, or digital signals having large numbers of bits. In that case, the reproduced PCM signal is not rectangular ("0" and "1") but is sinusoidal. Further, time base error components (Jitter) due to fluctuation of the tape running speed and the head drum rotation speed in the recording/reproducing apparatus are included in the reproduced PCM signal. Further, the level of the reproduced PCM signal varies with transmission gain (characteristic of electro-magnetic transducing system), and with time.

Accordingly, it is required that the reproduced signal be sliced or clipped with an accurate threshold level for wave-shaping to form a proper digital signal.

In conventional wave-shaping circuits of one kind, the level of the reproduced signal is fixed with an AGC circuit, and the reproduced signal is sliced or clipped with a fixed threshold level. In conventional wave-shaping circuits of another kind, the pedestal portion of the reproduced signal having a format of video signal is clamped to a fixed level, the peak of the reproduced signal is detected, and the clamped reproduced signal is clipped at a level of 50% of the peak value.

The conventional wave-shaping circuits of one kind have the problem that the AGC voltage detecting circuit and the AGC amplifier have some errors, and so a digital signal of accurate pulse width cannot be obtained. Further, the AGC voltage detecting circuit responds with some delay and some time constant may be present. Accordingly, such circuits have a further problem in that the AGC circuit cannot follow high speed searching mode with very much level variations.

In the conventional wave-shaping circuits of the other kind, the peak detector responds with a delay to the reproduced signal to be detected. Accordingly, the reproduced signal to be clipped should be delayed and a delay line is required which makes such circuit complicated. A pseudo signal such as a ringing signal is included in the reproduced PCM signal having the format of a video signal, and it has some influence on the threshold level. Accurate wave-shaping operation cannot be obtained. Further, the transmission characteristic of the recording medium is non-linear. Accordingly, when the reproduced signal is clipped with a threshold level of 50% of the peak value of the reproduced signal, the pulse widths of the digital signals "1" and "0" are not equal to each other.

Since the clipping level is not proper for the reproduced signal, the error bits are increased. The reproduced analogue signal is distorted and click noise occurs.

SUMMARY OF THE INVENTION

Accordingly, it is an object of this invention to provide a wave-shaping circuit for digital signals for solving the described problem.

Another object of this invention is to provide a wave-shaping circuit for digital signals in which the digital signal which has been distorted through the transmission system of the magnetic recording/reproducing apparatus is clipped with an accurate threshold level to obtain a digital signal having high and low level portions of regular pulse widths.

A further object of this invention is to provide a wave-shaping circuit for digital signals which can follow the input digital signal even though it has substantial level variations.

A further object of this invention is to provide a wave-shaping circuit for digital signal in which an accurate digital signal can be obtained even in a high speed searching operation.

In accordance with an aspect of this invention, a wave-shaping circuit for digital signal includes, (A) a slice or clipping circuit for slicing or clipping an input digital signal at a predetermined threshold level; (B) a detecting circuit for detecting the pulse widths of high and low level portions of the clipped digital signal; and (C) a control circuit which lowers the threshold level of said circuit when the pulse width of the high level portion of the digital signal is shorter than the normalized digital signal, and raises the threshold level of said slice circuit when the pulse width of the low level portion of the digital signal is shorter than the normalized digital signal.

Other objects, features and advantages according to the present invention will become apparent during the course of the description which follows.

BRIEF DESCRIPTION OF THE DRAWINGS

FIG. 1 is a circuit diagram of a wave-shaping circuit for a reproduced PCM signal according to one embodiment of this invention;

FIGS. 2A and 2B illustrate wave forms of signals at respective portions in FIG. 1;

FIG. 3A illustrates the wave form of an input reproduced PCM signal together with threshold levels;

FIG. 3B and FIG. 3C illustrate wave forms of the sliced PCM signals; and

DESCRIPTION OF THE PREFERRED EMBODIMENTS

Figure 4:
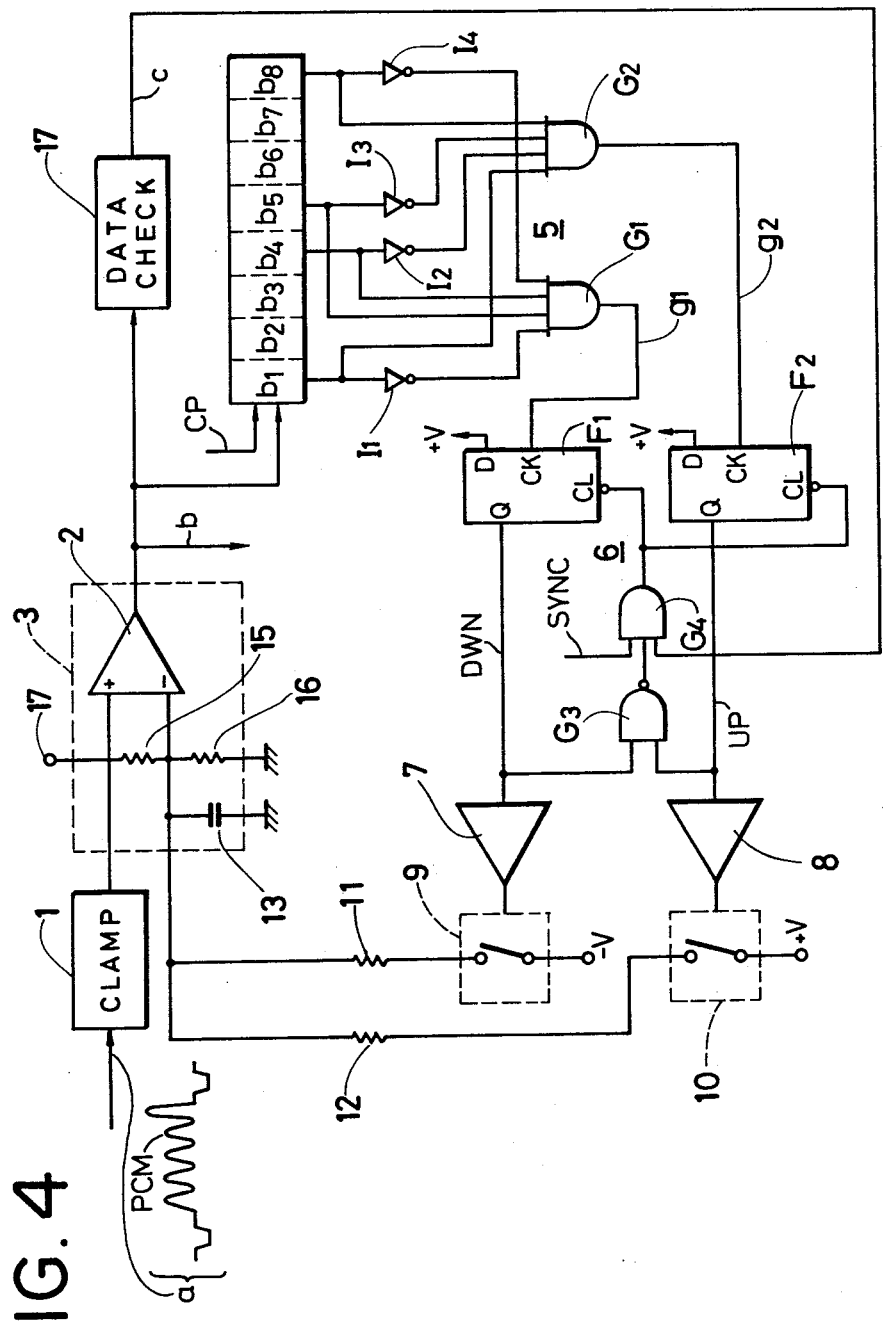
FIG. 4 is a circuit diagram of a wave-shaping circuit for a reproduced PCM signal according to another embodiment of this invention.

The embodiments of the invention will be described with reference to the drawings. FIG. 1 is a wave-shaping circuit for a reproduced PCM signal. FIGS. 2A and 2B show wave forms of signals at the respective points in FIG. 1. A PCM signal a reproduced in a VTR and has the format of a video signal. PCM signals are inserted during the horizontal periods. FIG. 2A illustrates the wave-shape of the PCM signals a of the reproduced signals. Although such signals have been recorded as rectangular digital signals, they are reproduced as a sinusoidal wave. In this embodiment, the recorded PCM signal is a NRZ (Non-Return to Zero) signal of a single polarity.

The reproduced PCM signals a are supplied to a clamp circuit 1 and the pedestal level of the reproduced signals is clamped at a fixed level. The output of the clamp circuit 1 is supplied to a slice of clipper circuit 3 which includes a level comparator 2, and sliced at threshold or slice levels which are controlled in the manner to be hereinafter described. Normalized PCM signals b are obtained from the slice circuit 3 as shown in FIG. 2B. They change from "0" and "1". The pulse widths are nearly equal to each other.

The output b of the slice circuit 3 is supplied to a shift register 4 for 8 bits. Clock pulses CP having one eighth ($\frac{1}{8}$) of the time width T of the PCM signal shown in FIG. 2B are supplied to a clock terminal of the shift register 4. The frequency of the clock pulses CP is eight times as high as the frequency of the bit clock of the PCM signal. Thus, one bit of the data of the PCM signal is stored in the shift register 4, and it is divided to 8 bits of parallel outputs of the shift register 4 to allow estimating the length of one bit of the PCM signal. Thus, it can be estimated whether the slice level is proper or not. Now it is assumed that the pulse width of the signal "1" is shorter than that of the signal "0". When the signal "1" passes through the shift register 4, the parallel outputs thereof include one or more "0" bits.

The parallel outputs of the shift register 4 are supplied to a discriminating circuit 5 which includes inverters $I_1$ to $I_4$ and AND gates $G_1$ and $G_2$ connected as shown. When one bit length of the PCM signal is shorter or longer than the normal time width, a detecting signal $g_1$ or $g_2$ is obtained from the discriminating circuit 5. The detecting signals $g_1$ and $g_2$ are supplied to a latch circuit 6 in which includes flip-flops $F_1$ and $F_2$ which respectively receive $g_1$ and $g_2$. A control signal DWN to lower the threshold level of the slice circuit 3 is produced by one flip-flop $F_1$. Another control signal UP for raising the threshold level of the slice circuit 3 is obtained from the other flip-flop $F_2$.

The control signals DWN and UP are supplied through buffer amplifiers 7 and 8 to control terminals of switching circuits 9 and 10, respectively. Movable contacts of the switching circuits 9 and 10 are connected to negative and positive power sources $-V$ and $+V$, respectively. Stationary contacts of switches 9 and 10 are connected through resistors 11 and 12 to the $(-)$ input terminal (reference input terminal) of the comparator 2. A capacitor 13 is connected between the $(-)$ input terminal of the comparator 2 and ground. When the control signal DWN reaches a high level, the switching circuit 9 is closed, and the threshold level applied to the $(-)$ input terminal of the comparator 2 is decreased with a time constant which is determined by the capacitor 13 and the resistor 11. This time constant $C_{13}R_{11}$ may be about several tens milliseconds. When the control signal UP has a high level, the switching circuit 10 is closed, and the threshold level is increased with a time constant which is determined by the capacitor 13 and the resistor 12.

When the control signals DWN and UP are not formed, a threshold level which is formed by a dividing circuit consisting of resistors 15 and 16 is applied to the $(-)$ input terminal of the comparator 2. For example, a predetermined power source voltage is applied to an input terminal 17 of the dividing circuit. Also, 50% of the peak value of the output of the clamp circuit 1 may be supplied to the $(-)$ input terminal of the comparator 2. In that case, the peak of the output of the clamp circuit 1 is detected and held by a peak detector (not shown), and the held peak value is supplied to the input terminal 17 of the dividing circuit which consists of the resistors 15 and 16.

Operation of the wave-shaping circuit of FIG. 1 will be described with reference to FIGS. 3A, 3B and 3C.

The solid line in FIG. 3A illustrates the enlarged reproduced PCM signal a. Dashed lines show different threshold levels $L_1$ to $L_9$ that can be set in the comparator 2. The positive side of the signal a corresponds to the signal "1", while the negative side corresponds to the signal "0". FIG. 3B is the wave form of the output b (PCM signal) of the slice circuit 3, when the reproduced PCM signal a is sliced at the higher threshold level $L_2$. The wave-shaped PCM signal b is supplied to the shift register 4, and it is in turn there shifted by the clock pulse CP which has a frequency of eight times as high as the frequency of the bit clock. Whenever the "1" portion of the PCM signal b shown in FIG. 3B passes through the shift register 4, the parallel outputs of the bits $b_1$ to $b_8$ of the shift register 4 becomes "00111100" once per eight shifts. In that condition, the outputs of the first and eighth bits $b_1$ and $b_8$ of the shift register 4 are "0", while the outputs of the fourth and fifth bits $b_4$ and $b_5$ are "1".

In the discriminating circuit 5, the outputs of the first and eighth bits $b_1$ and $b_8$ of the shift register 4 are supplied through the inverters $I_1$ and $I_4$ to the two input terminals of the AND gate $G_1$, and the outputs of the fourth and fifth bits $b_4$ and $b_5$ of the shift register 4 are supplied directly to the other two input terminals of the AND gate $G_1$. The output of the AND gate $G_1$ becomes high. Thus, the detecting signal $g_1$ is obtained from the AND gate $G_1$, and it is supplied to a clock terminal CK of the flip-flop $F_1$. It reads out a data input D of high level ($+V$), and it is put into the set condition. Thus, the control signal DWN is obtained from a Q terminal of the flip-flop $F_1$ which will close the switching circuit 9 and therefore decrease the threshold level of the comparator 2.

Whenever the PCM signal b passes through the shift register 4, the outputs of the bits $b_1$ to $b_8$ of the shift register 4 become transiently "11110000", "00001111" and so on. However, in those conditions, one of the outputs of either the first and eighth bits $b_1$ and $b_8$ will not be "0". Accordingly, the detecting signal $g_1$ is not obtained.

When the PCM signal a is sliced at a threshold level within the threshold levels $L_4$ to $L_7$, and the "0" portion of the PCM signal a passes through the shift register 4, all of the parallel outputs of the bits $b_1$ to $b_8$ of the shift register 4 become "0". When more than two adjacent or successive "0" portions of the PCM signal a are sliced with threshold levels within the threshold levels $L_7$ to $L_9$, and they pass through the shift register 4, all of the parallel outputs of the bits $b_1$ to $b_8$ of the shift register 4 become "0". In those cases, the control signal DWN for lowering the threshold level should be inhibited and prevented from being formed. For this purpose, the outputs of the fourth and fifth bits $b_4$ and $b_5$ of the shift register 4 become "1" at the same time and are added to obtain the detecting signal $g_1$. Accordingly, only when the PCM signal is sliced with the threshold level within the threshld levels $L_1$ to $L_3$ will the control signal DWN be obtained.

FIG. 3C shows wave form of the PCM signal b in the case when the PCM signal a is sliced with a too low threshold level $L_8$. In this case, when the "1" portion of the PCM signal b passes through the shift register 4, the control signal DWN will not be formed. When the "0" portion of the PCM signal b passes through the shift register 4, the parallel outputs of the bits $b_1$ to $b_8$ become "11000011". In the discriminating circuit 5, the outputs of the first and eighth bits $b_1$ and $b_8$ are supplied to the two input terminals of the AND gate $G_2$, and the outputs of the fourth and fifth bits $b_4$ and $b_5$ are supplied through the inverters $I_2$ and $I_3$ to the other two input terminals of the AND gate $G_2$. The detecting signal $g_2$ is obtained from the AND gate $G_2$, and it is supplied to a clock input terminal CK of the flip flop $F_2$ to set it. The control signal UP is obtained from the Q output terminal of the flip-flop $F_2$. The switching circuit 10 is closed with the control signal UP, so that the threshold level is increased in the slice circuit 3.

The control signal UP can be formed within the threshold levels $L_7$ to $L_9$. The condition under which the detecting signal $g_2$ is obtained from the AND gate $G_2$, is similar to that for the case when the "1" portion of the PCM signal a passes through the shift register 4.

In the above-described manner, the pulse widths of the "1" and "0" portions of the PCM signals b obtained from the slice circuit 3 are alternately discriminated. With the discrimination results, the threshold level is so controlled that the pulse widths of the signals "0" and "1" become equal to each other. Thus, almost normalized PCM signals can be reproduced.

A circuit for the flip-flop $F_1$ and $F_2$ in the latch circuit 6 which forms the control signals DWN and UP will be described. The control signals DWN and UP are supplied to a NAND gate $G_3$. When the control signals DWN and UP become high level "1", output of the NAND gate $G_3$ becomes low level "0". Output terminal of the NAND gate $G_3$ is connected to an AND gate $G_4$. When the output of the NAND gate $G_3$ becomes low level "0", the output of the AND gate $G_4$ becomes low level "0" to clear the flip-flops $F_1$ and $F_2$. When the PCM signal is sliced with the threshold level $L_2$ shown in FIG. 3A, the control signal DWN is formed in the above-described manner to lower the threshold level. The threshold level is lowered to $L_7$ and the control signal UP is formed. Thus, the flip-flops $F_1$ and $F_2$ are cleared, and the control signals UP and DWN become "0".

The command range of the threshold level extends from the level $L_3$ to the level $L_7$. The control signals DWN and UP are formd above and under the command range, respectively. When the threshold level is controlled across the command range, the control signals DWN and UP are not produced. When the control signals DWN and UP are dissipated, the PCM signal is sliced with the threshold level which is determined by the dividing circuit consisting of the resistors 15 and 16 connected to the (−) input terminal of the comparator 2.

When the reproduced PCM signal a is not present (the signal "0" continues) when either of the control signals DWN and UP is formed, the control signal DWN or UP will not be cleared, but the control system will be set to one control condition. For avoiding such control condition, a vertical or horizontal synchronizing signal SYNC is supplied to one input terminal of the AND gate $G_4$. The control signals UP or DWN is cleared whenever the synchronizing signal SYNC is generated.

FIG. 4 shows a wave-shaping circuit for the reproduced PCM signal according to another embodiment of this invention.

When a PCM signal to be recorded in the VTR is monitored, it is supplied directly to the wave-shaping circuit of FIG. 1, not through an electro-magnetic transducing system (magnetic head and tape). The PCM signal to be recorded is normalized, but it includes ringing and overshoot components at its leading edge portion and trailing edge portion. In the wave-shaping circuit of FIG. 1, the threshold level is often erroneously set to the high level portion or low level portion of the PCM signal due to the ringing and overshoot components on the supply power source. As above described, when the digital signal "1" or "0" of the PCM signal continues for an unduly long time, the threshold level is controlled only in one direction, so that the control system becomes unstable.

In the embodiment of FIG. 4, by using an error detecting code such as CRC (Cyclic Redundancy Check) added in the PCM signal to be recorded such that an error bit is included in the PCM data. When the error bit is detected, the control signals DWN and UP are cleared. For that purpose, a data check circuit 17 is connected to the slice circuit 3 in the embodiment of FIG. 4. The output (PCM signal b) of the slice circuit 3 is supplied to the data check circuit 17. When the threshold level supplied to the comparator 2 of the slice circuit 3 is erroneously set for the above-described reason, the output c of the data check circuit 17 becomes low, since the error bit is included in the wave-shaped PCM signal b. The output c of the data check circuit 17 is supplied to the AND gate $G_4$. The output of the AND gate $G_4$ becomes low. As a result, the flip-flops $F_1$ and $F_2$ for forming the control signals DWN and UP are cleared.

Although the embodiments of this invention have been described, this invention is not limited to these embodiments, but various modifications are possible within the technical concepts of this invention.

For example, after the level of the PCM signal is fixed with an AGC circuit, the PCM signal may be supplied to the wave-shaping circuit of FIG. 1 or FIG. 2.

In the above embodiments, the threshold level is lowered or raised at the predetermined time constant in response to the control signals DWN or UP. Instead, prepared different threshold levels may be selected in respone to the control signals UP or DWN.

The shift register 4 of FIG. 1 or FIG. 4 may comprise a counter. The period of the digital signal "1" or "0" of the PCM signal b is measured by predetermined clock pulses in the counter. The control signal UP or DWN is formed on the basis of the measurement result.

Although the invention has been described with respect to preferred embodiments, it is not to be so limited as changes and modifications can be made which are within the full intended scope of the invention as defined by the appended claims.

We claim as our invention:

1. A wave-shaping circuit for digital signal comprising:
    (A) a slice circuit for slicing a time varying input signal at a predetermined threshold level, so as to produce a digital signal having high and low level portions;
    (B) a detecting circuit for detecting the pulse widths of high and low level portions of the digital signal from said slice circuit during a predetermined period; and
    (C) a control circuit which lowers the threshold level of said slice circuit when the pulse widths of the high level portion of the digital signal are less than a predetermined width, and raises the threshold level of said slice circuit when the pulse width of the low level portion of the digital signal is less than a predetermined width, and in which said detecting circuit includes an n-bit, where n is an integer larger than 1, shift register which successively shifts the output of said slice circuit in response to a shift clock signal, and a discriminating circuit for decoding the parallel outputs of said shift register.

2. A wave-shaping circuit for digital signal according to claim 2, in which said shift register is of the 8-bit type.

3. A wave-shaping circuit for digital signal according to claim 2, in which said shift clock signal for said shift register is n times as high as the frequency of the bit clock of said input digital signal.

4. A wave-shaping circuit for digital signal according to claim 2, in which said discriminating circuit comprises inverters and gate circuits which detect codes wherein all of the parallel bit outputs of said shift register are "1" or "0", and generates a first detecting signal when the most and least significant bits of the parallel bit outputs of said shift register are "0", and at least two bits of the intermediate bits of the parallel bit outputs of said shift register are "1", and generates a second detecting signal when either the most or least significant bits of the parallel bit outputs of said shift register is "1", and at least two bits of the intermediate bits of the parallel bit outputs of said shift register are "0".

5. A wave-shaping circuit for digital signal according to claim 2, in which said slice circuit includes a comparator having a first input terminal for receiving said input signal and a second input terminal for receiving said threshold level signal.

6. A wave-shaping circuit for digital circuit according to claim 5, in which a clamp circuit is connected to said first input terminal of the comparator, and the pedestal level of said input digital signal is clamped to a predetermined potential by said clamp circuit.

7. A wave-shaping circuit for digital signal comprising:
(A) a slice circuit for slicing a time varying input signal at a predetermined threshold level, so as to produce a digital signal having high and low level portions;
(B) a detecting circuit for detecting the pulse widths of high and low level portions of the digital signal from said slice circuit during a predetermined period; and
(C) a control circuit which lowers the threshold level of said slice circuit when the pulse widths of the high level portion of the digital signal are less than a predetermined width, and raises the threshold level of said slice circuit when the pulse width of the low level portion of the digital signal is less than a predetermined width, and, in which said control circuit includes a latch circuit for memorizing the output of said detecting circuit.

8. A wave-shaping circuit for digital signal according to claim 7, in which said latch circuit includes first and second flip-flops, said first flip-flop is set with said first detecting signal to form a first control signal for lowering the threshold level of said slice circuit, and said second flip-flop is set with said second detecting signal to form a second control signal for raising the threshold level of said slice circuit.

9. A wave-shaping circuit for digital signal according to claim 8, in which said control circuit further includes a circuit for clearing said first and second flip-flops when both of said flip-flops are set.

10. A wave-shaping circuit for signal according to claim 9, in which said control circuit further includes a circuit for clearing said first and second flip-flops with the synchronizing signal of said input digital signal.

11. A wave-shaping circuit for digital signal according to claim 10, in which said control circuit includes first and second switching circuits connected to negative and positive power sources for changing the threshold level, and a time constant circuit connected between the output terminals of said first and second switching circuits and said second input terminal of the comparator.

12. A wave-shaping circuit for digital signal according to claim 11, in which said first switching circuit is closed by said first control signal to lower the threshold level towards the potential of said negative power source with a time constant of said time constant circuit, and said second switching circuit is closed by said second control signal to raise the threshold level towards the potential of said positive power source with a time constant of said time constant circuit.

13. A wave-shaping circuit for digital signal according to claim 6, in which said circuit further includes a data check circuit connected to receive the output of said slice circuit, and, with its output connected to said latch circuit.

* * * * *